US007196005B2

(12) United States Patent
Ho

(10) Patent No.: US 7,196,005 B2
(45) Date of Patent: Mar. 27, 2007

(54) DUAL DAMASCENE PROCESS WITH DUMMY FEATURES

(75) Inventor: Bang-Ching Ho, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/933,589

(22) Filed: Sep. 3, 2004

(65) Prior Publication Data

US 2006/0051958 A1 Mar. 9, 2006

(51) Int. Cl.
*H01L 21/4763* (2006.01)
(52) U.S. Cl. .............................. 438/638; 257/E21.036
(58) Field of Classification Search ................ 438/687, 438/638; 257/E21.033, E21.036
See application file for complete search history.

(56) References Cited

U.S. PATENT DOCUMENTS

| | | | |
|---|---|---|---|
| 6,664,011 B2 | 12/2003 | Lin et al. | |
| 6,794,293 B2* | 9/2004 | Li et al. | 438/700 |
| 2003/0091907 A1* | 5/2003 | Horak et al. | 430/5 |
| 2003/0104319 A1 | 6/2003 | Lin et al. | |
| 2003/0170978 A1* | 9/2003 | Lee | 438/638 |
| 2004/0004290 A1* | 1/2004 | Furukawa et al. | 257/774 |
| 2004/0043618 A1* | 3/2004 | Hellig et al. | 438/694 |
| 2004/0161927 A1* | 8/2004 | Hu et al. | 438/653 |

OTHER PUBLICATIONS

Bergeron, David, "Resolution Enhancement Techniques for the 90-nm Technology Node and Beyond", Future Fab International, www.future-fab.com, printed on Apr. 28, 2004, 10 pages.
Lucas, Kevin, "Achieving the 90nm Lithography Generation with Model-Based OPC", Future Fab International, www. future-fab.com, printed on Apr. 28, 2004, 12 pages.
Mack, Chris A., et al., "Impact of Mask Errors on Optical Lithography", Yield Management Solutions, Spring 2000, pp. 57-61.
Peterson, Bill, et al., "Approaches to Reducing Edge Roughness and Substrate Poisoning of ESCAP Photoresists", www.semiconductorfabtech.com, printed on Apr. 28, 2004, 8 pages.
Pollentier, Ivan, et al., "Dual Damascene Back-end Patterning Using 248nm and 193nm Lithography", Semiconductor Fabtech—13th edition, Mar. 2001, pp. 227-234.
Spence, Chris, "Mask Data Preparation Issues for the 90 nm Node: OPC Becomes a Critical Manufacturing Technology", Future Fab International, www.future-fab.com, printed on Apr. 28, 2004, 7 pages.

* cited by examiner

*Primary Examiner*—Caridad Everhart
(74) *Attorney, Agent, or Firm*—Haynes and Boone, LLP

(57) ABSTRACT

A method for creating a hole in a semiconductor wafer includes forming a hard mask over a dielectric layer, the hard mask including a solid portion and a first opening. A patterning layer is provided over the hard mask, the patterning layer including second and third openings. The second opening of the patterning layer aligns with the first opening of the hard mask and the third opening of the patterning layer aligns with the solid portion of the hard mask. The hole is created in the dielectric layer using the second opening of the patterning layer and the first opening of the hard mask.

20 Claims, 8 Drawing Sheets

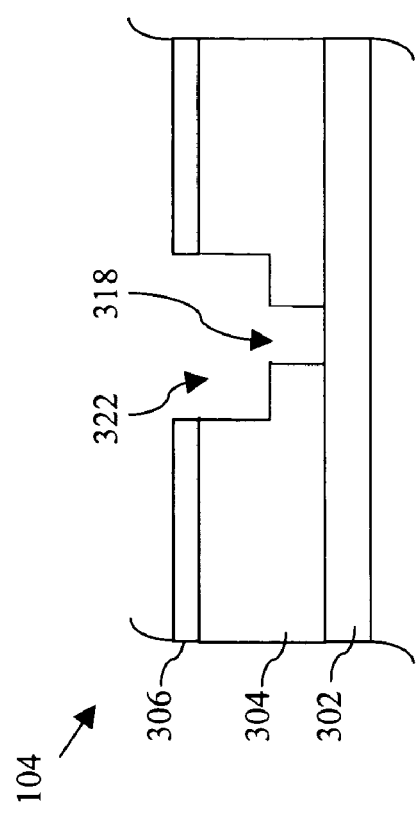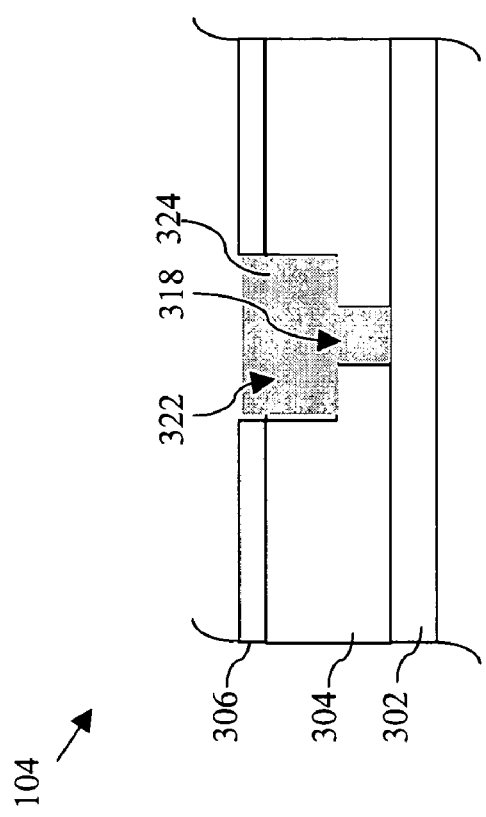

DUAL DAMASCENE PROCESS WITH DUMMY FEATURES

CROSS-REFERENCE

This application is related to the U.S. Pat. No. 6,664,011, disclosure of which is hereby incorporated by reference.

This application is also related to application Ser. No. 2003/0104319, disclosure of which is hereby incorporated by reference.

BACKGROUND

Microelectronic device geometries have dramatically decreased in size since such devices were first introduced several decades ago. Due to ever shrinking geometries, changes have been made throughout the semiconductor manufacturing process. For example, photolithography has adopted the use of phase shifting masks, optical proximity correction, off-axis illumination, and other techniques for extending process capability to ever shrinking design rules. However, such techniques still do not provide high depth of focus (DOF) and low mask error enhancement factor (MEF or MEEF), which may be defined as the ratio between incremental change of the image dimension and the incremental change of the object dimension on a mask. High DOF and low MEF (less than or equal to 1) are essential when utilizing high numerical aperture (NA) optics and for resolving device feature sizes of 90 nm and smaller.

Therefore, what is needed is a method of manufacture and system that addresses the issues discussed above.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 3a–j are sectional views of at least a portion of one embodiment of an interconnect constructed according to aspects of the present disclosure.

DETAILED DESCRIPTION

Figure 1:
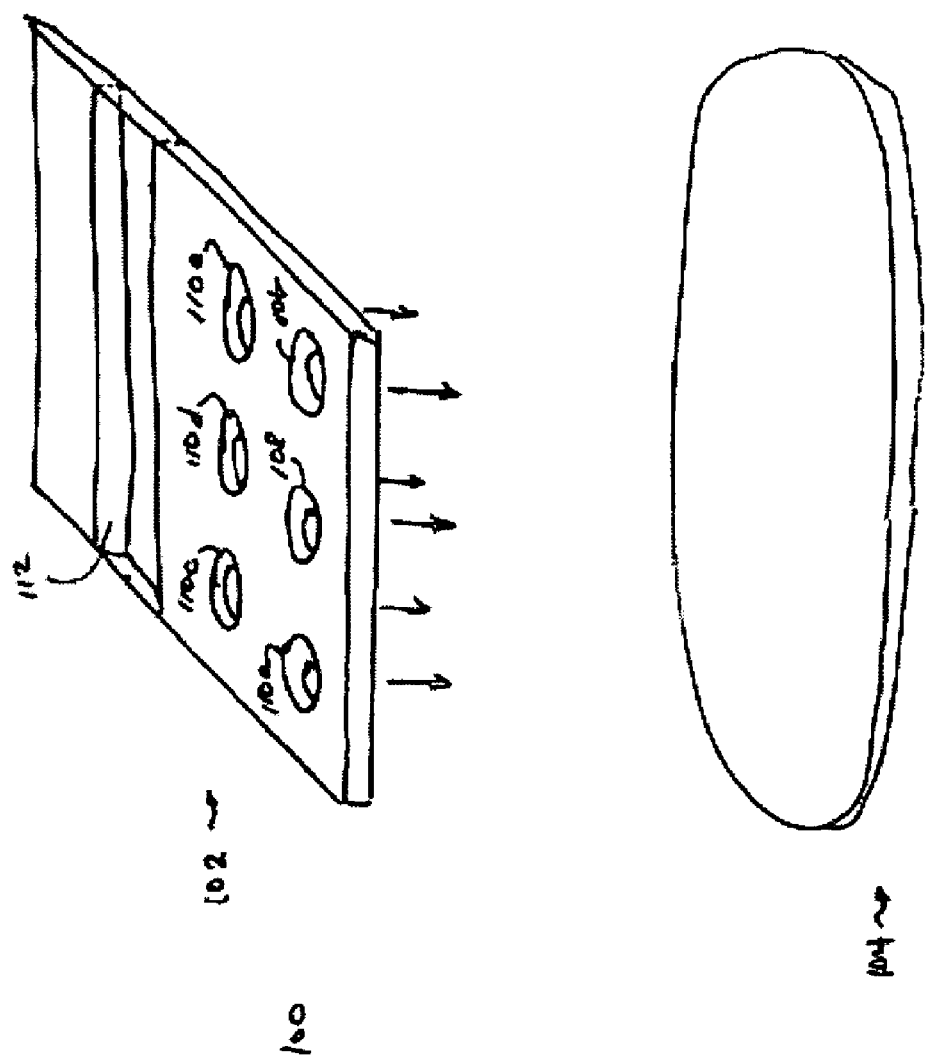
FIG. 1 is an illustration of a portion of a lithographic system constructed according to aspects of the present disclosure.

It is to be understood that the following disclosure provides many different embodiments, or examples, for implementing different features of the present invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Furthermore, the terms "openings" and "features" may be used interchangeably herein.

Referring to FIG. 1, a lithographic system 100 includes a reticle 102 and a substrate 104 to be patterned. The reticle 102 can be of many different types and made of different materials, as is well known in the art. The reticle 102 includes a substrate having circular openings 108, dummy openings 110a–e, and elongated openings 112. The openings 108, 110a–e, and 112, transparent or opaque, are illustrated in an exaggerated manner in FIG. 1, and many more openings can be provided in different embodiments. The openings or "holes" can be utilized for defining vias, contacts, trenches, and/or other features which may be formed over or in the substrate 104. The openings may include pre-determined geometric dimensions such as diameter D (opening size) and pitch P (center-to-center spacing between openings).

The substrate 104 may include a plurality of microelectronic devices disposed upon the suniconductor substrate such as N-type metal oxide semiconductor (NMOS) devices, P-type metal oxide semiconductor (PMOS) devices, electrically programmable read only memory (EPROM) devices, electrically erasable programmable read only memory (ERPROM) devices, static random access memory (SHAM) devices, dynamic random access memory (DRAM) devices, single electron transistor (SET) devices, magnetic random access memory (MRAM), chalcogenide random access memory (C-RAM), "fin-shaped" field effect transistor (FinFET) devices, diodes, capacitors, inductors, and/or other Microelectronic devices (hereafter collectively referred to as microelectronic devices). Furthermore, although the substrate 104 is a semiconductor wafer in the present embodiments, it is understood that various substrates can benefit from the present invention. The substrate 104 can further include a plurality of features formed from one or more of the openings 108, 110a–e, and 112 on the reticls 102, as further described below.

Figure 2:
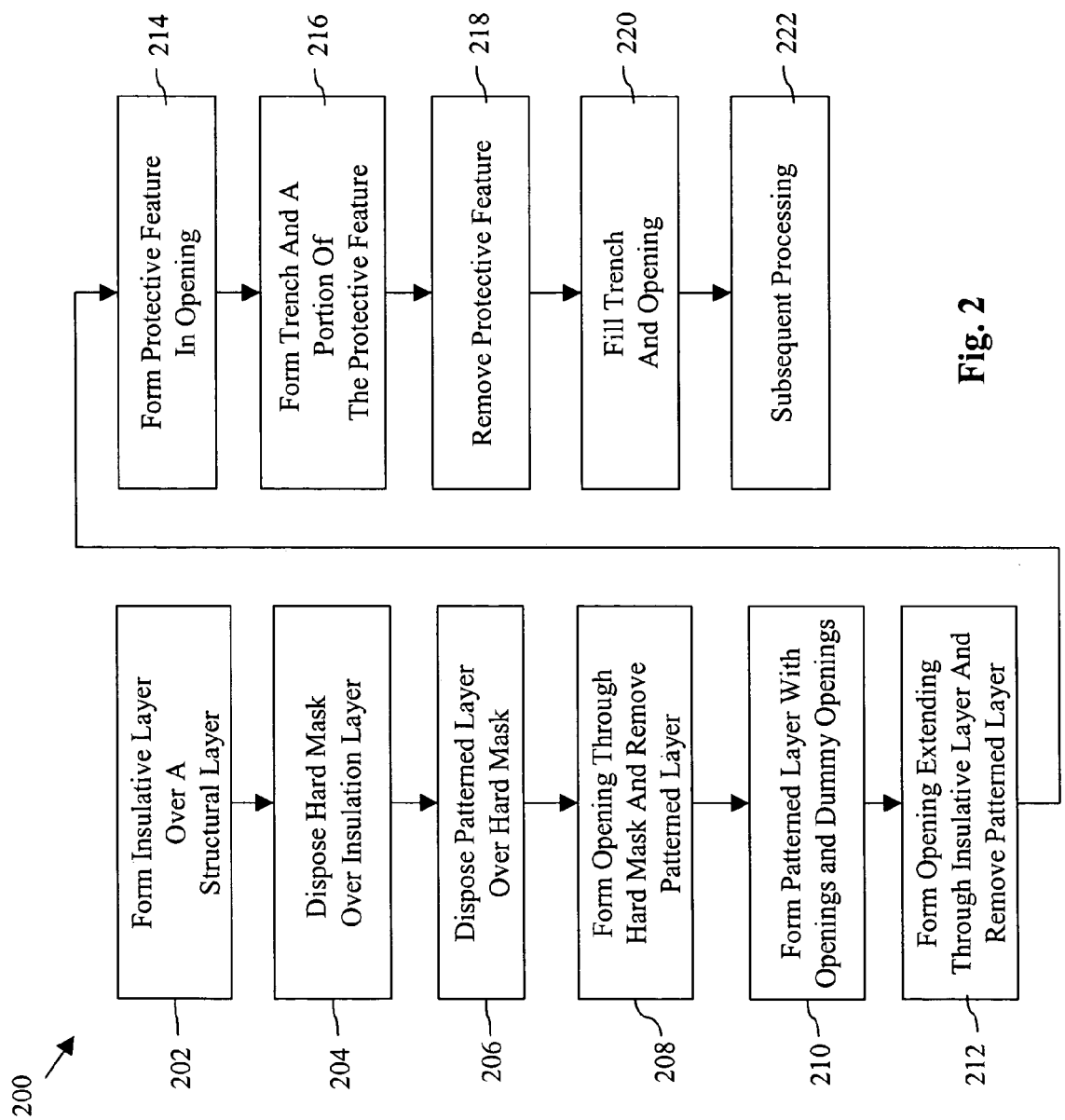
FIGS. 2 and 4 are flowcharts of methods for performing one or more embodiments of the present disclosure.

Referring to FIG. 2a, a method 200 can be used for processing the substrate 104 using the lithographic system 100. It is understood that the substrate 104 may have several preliminary processing steps performed before or after. For the sake of further example, reference will be made to FIGS. 1 and 3a–3j to illustrate the steps of the method 200.

Figure 3C:
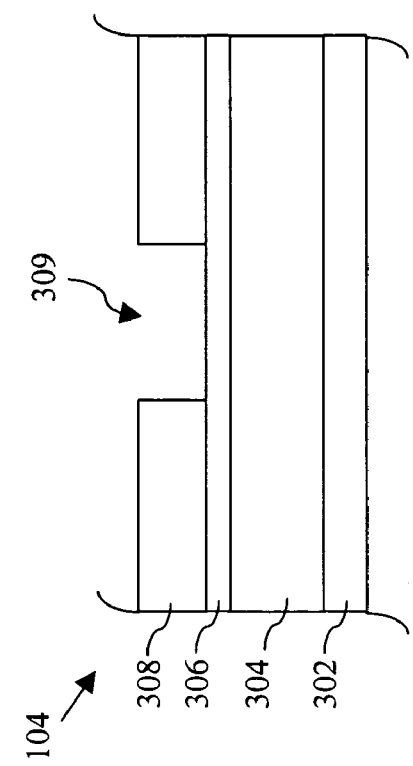
Figure 3D:
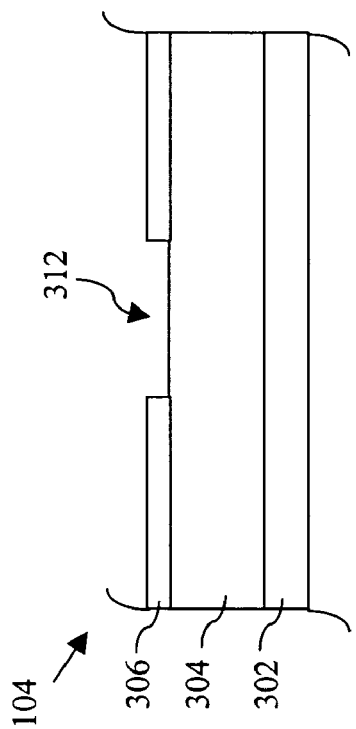
Figure 3A:
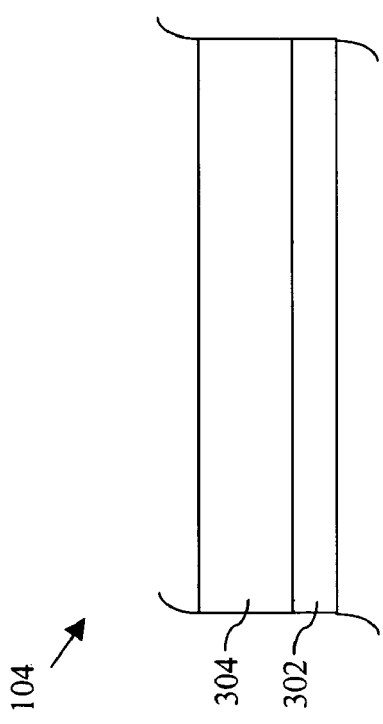

Referring specifically to FIGS. 2a and 3a, execution of the method 200 begins at step 202, wherein an insulative layer 304 is formed over a structural layer 302. In the present embodiment, the insulative layer 304 is a low-k film. In other embodiments, the insulative layer 304 may include silicon dioxide ($SiO_2$), tetraethylorthosilicate (TEOS) oxide, silicon nitride ($Si_xN_y$), borophosphosilicate glass (BPSG), and/or fluoride-doped silicate glass (FSG). The insulative layer 304 may also include one or more low-k dielectric layers such as Black Diamond® (a product of Applied Materials of Santa Clara, Calif.), Xerogel, Aerogel, amorphous fluorinated carbon, Parylene, BCB (bis-benzocyclobutenes), and SiLK™ (a product of Dow Chemical of Midland, Mich.), and/or other materials. The insulative layer 304 may be formed by chemical vapor deposition (CVD), plasma enhanced chemical vapor deposition (PECVD), atomic layer deposition (ALD), pulsed deposition layering (PDL), spin-on coating, and/or other processing techniques. Alternatively, the insulative layer 304 may be replaced with a semiconductor material or a conductive material.

The structural layer 302 may be any type of layer, including a metal layer such as copper (Cu), aluminum (Al), a dielectric layer such as silicon dioxide ($SiO_2$), a semiconductor layer such as silicon, gallium arsenide, gallium nitride, strained silicon, silicon germanium, silicon carbide, carbide, or diamond, and/or other layers. In one embodiment, the structural layer 302 comprises a silicon-on-insulator (SOI) substrate, such as a silicon-on-sapphire substrate, a silicon germanium-on-insulator substrate, or another substrate comprising an epitaxial or otherwise formed semiconductor layer on an insulator layer. The structural layer 302 may also or alternatively include an air gap, such as may be formed in a "silicon-on-nothing" (SON) structure.

Figure 3B:
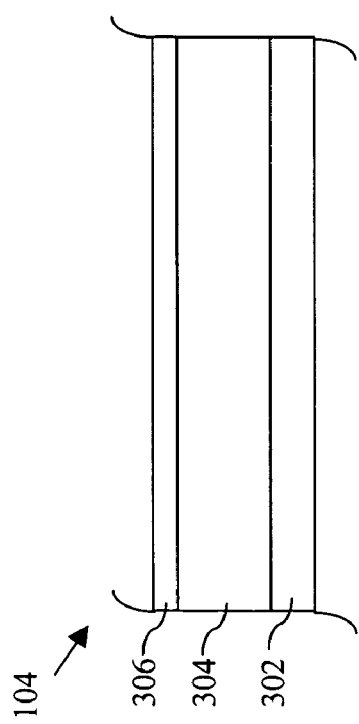

Referring also to FIG. 3b, at step 204, a hard mask layer 306 is disposed over the insulative layer 304. The hard mask layer 306 may be formed by CVD, PECVD, PDL, ALD, physical vapor deposition (PVD), spin-on coating, and/or other processing techniques. The hard mask layer 306 may include materials such as silicon nitride ($Si_xN_y$), silicon oxy-nitride (SiON), silicon carbide (SiC), silicon oxy-carbide (SiOC), silicon dioxide ($SiO_2$), thermal oxide, tetraethylorthosilicate (TEOS) oxide and/or other materials. Alternatively, the hard mask layer 306 may include a semiconductor material and/or conductive material.

Referring also to FIG. 3b, at step 206, a patterned layer 308 having an opening 309 is formed over the hard mask layer 306. The opening 309 may be adapted for forming vias, contacts, trenches, and/or other patterned features. The opening 309 may also include a pre-determined geometric dimension such as diameter D (opening size). The patterned layer 308 may include one or more layers comprising negative and/or positive photoresist, silicon dioxide ($SiO_2$), thermal oxide, tetraethylorthosilicate (TEOS) oxide, silicon nitride ($Si_xN_y$), silicon oxy-nitride (SiON), low-k dielectric, and/or other materials. The patterned layer 308 may be formed by spin-on coating, CVD, PECVD, ALD, thermal oxidation, photolithography, imprint lithography, immersion lithography, and/or other processing techniques.

The opening 309 can be created using a reticle similar to the reticle 102 of FIG. 1. The reticle would include the opening 108 but may not include any of the dummy openings 110a–e. The opening 108 would be comparatively large, as compared to other openings discussed further below.

Referring also to FIG. 3d, at step 208, an opening 312 extending through the hard mask layer 306 is formed and the patterned layer 308 is removed. The opening 312 may be formed by chemical etch, plasma etch, focused ion beam (FIB), electron beam, and/or other processing techniques. In one embodiment, the opening 312 may be formed in a plasma environment having reactant gases such as hydrochloric acid (HCl), hydrogen bromide (HBr), sulfur dioxide ($SO_2$), sulfur hexafluoride ($SF_6$), perfluorocarbons, and/or other reactants. Alternatively, the opening 312 may be formed by chemical etch which may include an environment having phosphoric acid ($H_3PO_4$), ammonium hydroxide ($NH_4OH$), hydrochloric acid (HCT), hydrofluoric acid (HF), sulfuric acid ($H_2SO_4$), and/or other chemicals.

The patterned layer 308 may be removed by plasma etch and/or chemical etch. For example, the patterned layer 308 may be removed by an oxygen ($O_2$) containing plasma environment.

Figure 3G:
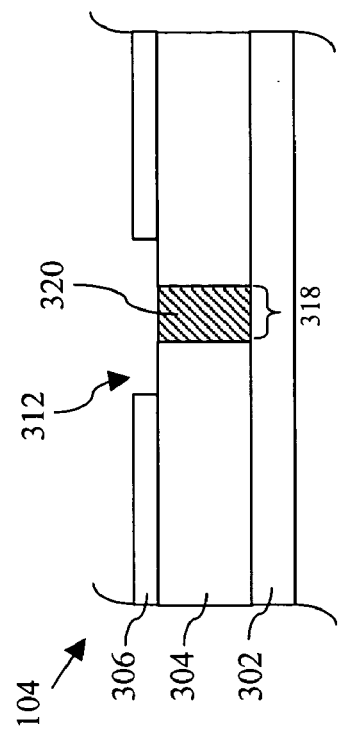
Figure 3H:
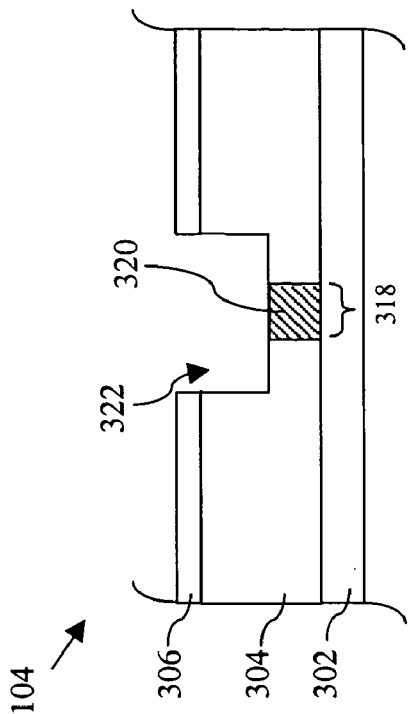
Figure 3E:
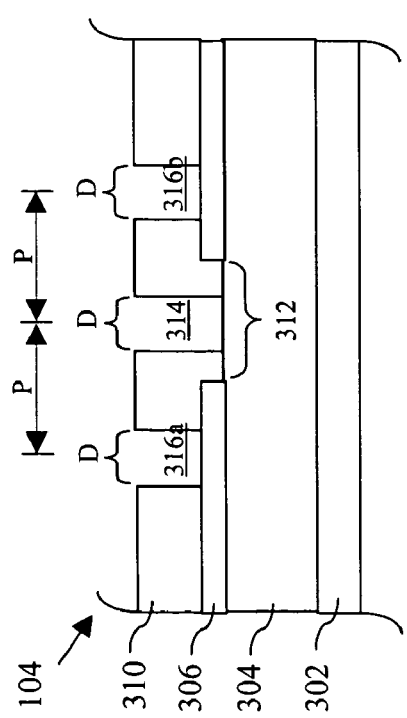

Referring also to FIG. 3e, at step 210, the patterned layer 310 having one or more openings 314 and one or more dummy openings 316a, 316b is disposed over the hard mask layer 306 and the opening 312. The patterned layer 310 may include one or more layers comprising negative and/or positive photoresist, silicon dioxide ($SiO_2$), thermal oxide, tetraethylorthosilicate (TEOS) oxide, silicon nitride ($Si_xN_y$), silicon oxy-nitride (SiON), low-k dielectric, and/or other materials. The patterned layer 310 may be formed by spin-on coating, CVD, PECVD, thermal oxidation, photolithography, imprint lithography, immersion lithography and/or other processing techniques.

The opening 314 may be utilized to form a feature positioned within the opening 312. The opening 314 may be adapted for forming vias, contacts, trenches, and/or other geometric patterns. The dummy openings 316a, 316b may be located over the hard mask 306 and may include pre-determined geometric dimensions such as diameter D (opening size) and pitch P (center-to-center spacing between openings). For example, the diameter D may range between about 5 Angstroms and about 2300 Angstroms. In one embodiment, the pitch P may scale according to a mathematical product of the diameter D multiplied by a constant κ, wherein κ ranges between about 1 and about 3. For example, if κ=2, the pitch P may range between about 10 Angstroms and about 4600 Angstroms.

The openings 314, 316a, 316b can be created using a reticle similar to the reticle 102 of FIG. 1. The reticle would include the opening 108 which corresponds to the opening 314 and the dummy openings 110a and 110b, which correspond to the openings 316a and 316b, respectively. The opening 108 would be comparatively small, as compared to other openings discussed above.

In one embodiment, the openings 312 may extend partially or completely through the hard mask layer 306 and the insulative layer 304 to form a larger opening 322 (FIG. 3i) which can be used for a dual damascene interconnect. The patterned layer 310 may include one or more layers comprising photoresist, silicon dioxide ($SiO_2$), silicon nitride ($Si_xN_y$), silicon oxy-nitride (SiON), backside anti-reflective coating (BARC), and/or other materials. The patterned layer 310 may be formed by spin-on coating, CVD, PECVD, and/or other processing techniques.

Figure 3F:
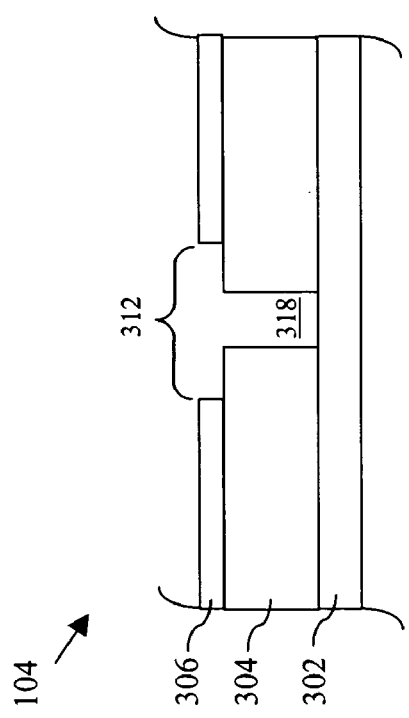

Referring also to FIG. 3f, at step 212, an opening 318 extending through the insulative layer 304 is formed. The opening 318 may be formed by chemical etch, plasma etch, focused ion beam (FIB), electron beam, and/or other processing techniques. The opening 318 may include a via, a contact, a trench, and/or other geometric features. In one embodiment, the opening 318 may be formed in a plasma environment having reactant gases such as hydrochloric acid (HCl), hydrogen bromide (HBr), sulfur dioxide ($SO_2$), Chlorine ($Cl_2$), sulfur hexafluoride ($SF_6$), perfluorocarbons, and/or other reactants. Alternatively, the opening 318 may be formed by chemical etching which may include an environment having phosphoric acid ($H_3PO_4$), ammonium hydroxide ($NH_4OH$), hydrochloric acid (HCl), hydrofluoric acid (HF), sulfuric acid ($H_2SO_4$), and/or other chemicals.

The patterned layer 310 may be removed by plasma etch and/or chemical etch. For example, the patterned layer 310 may be removed by an oxygen ($O_2$) containing plasma environment.

Referring also to FIG. 3g, at step 214, a protective feature 320 is formed within the opening 318. The protective feature 320 may include a plug substantially filling the opening 318. Alternatively, the protective feature 320 may include a liner located substantially over the bottom and sidewalls of the opening 318. The protective feature 320 may include one or more layers comprising photoresist, silicon, polysilicon, silicon dioxide ($SiO_2$), tetraethylorthosilicate (TEOS) oxide, silicon nitride ($Si_xN_y$), borophosphosilicate glass (BPSG), fluoride-doped silicate glass (FSG), low-k dielectric, polymer, and/or other materials. The protective feature 320 may be formed by selective epitaxial growth (SEG), CVD, PECVD, ALD, PVD, electrophoresis, spin-on coating, chemical mechanical polishing or chemical mechanical planarization (hereafter collectively referred to as CMP), and/or other processing techniques. In one embodiment, the protective feature 320 may also be formed in the opening 312 (FIG. 3d). The opening 312 may extend through the insulative layer 304.

Referring also to FIG. 3h, at step 216, the opening 322 extending partially through the insulative layer 304 and the protective feature 320 is formed over the opening 318. The larger opening 322 may be formed by chemical etch, plasma etch, focused ion beam (FIB), electron beam, and/or other processing techniques. In one embodiment, the opening 322 may be formed in a plasma environment having reactant gases such as hydrochloric acid (HCl), hydrogen bromide (HBr), sulfur dioxide ($SO_2$), Chlorine ($Cl_2$), sulfur hexafluoride ($SF_6$), perfluorocarbons, and/or other reactants. The depth may be determined during the formation of the opening 322. For example, the depth may be pre-determined by a process endpoint, which may be determined through process time, optical emission spectroscopy (OES), residual gas analysis (RGA), laser diffraction, process pressure, and/or other process endpoint detection techniques. Alternatively, the opening 322 may be formed by chemical etch which may include an environment having phosphoric acid ($H_3PO_4$), ammonium hydroxide ($NH_4OH$), hydrochloric acid (HCl), hydrofluoric acid (HF), sulfuric acid ($H_2SO_4$), and/or other chemicals.

Referring also to FIG. 3i, at step 218, protective feature 320 is removed from the opening 318. The protective feature 320 may be removed by plasma etch, chemical etch, thermal burn-out, and/or other processing techniques. For example, the protective feature 320 may be removed by an oxygen ($O_2$) containing plasma environment. The protective feature 320 may also be removed by a plasma environment which may include reactant gases such as hydrochloric acid (HCl), hydrogen bromide (HBr), sulfur dioxide ($SO_2$), Chlorine ($Cl_2$), sulfur hexafluoride ($SF_6$), perfluorocarbons, and/or other reactants. Alternatively, the protective feature 320 may be removed by chemical etch which may include phosphoric acid ($H_3PO_4$), ammonium hydroxide ($NH_4OH$), hydrochloric acid (HCl), hydrofluoric acid (HF), sulfuric acid ($H_2SO_4$), hydrogen peroxide ($H_2O_2$), de-ionized water, and/or other chemicals.

Referring also to FIG. 3j, at step 220, the larger opening 322 and smaller opening 318 are filled with a conductive material 324. The conductive material 324 may be formed by PVD, CVD, PECVD, ALD, PDL, spin-on coating, and/or other processing techniques. The conductive material 324 may include single and/or multiple layers of conductive material. For example, the conductive material 324 may include a barrier layer and bulk filling material. The barrier layer may include titanium (Ti), tantalum (Ta), titanium nitride (TiN), tantalum nitride (TaN), titanium tungsten (TiW), tungsten nitride (WN), silicon carbide (SiC), silicon oxy-carbide (SiOC), and/or other materials. The bulk filling material may include aluminum (Al), copper (Cu), gold (Au), silver (Ag), carbon nano-tubes, and/or other materials.

At step 222, subsequent processing may be performed to form other features located above the interconnect. For example, the steps 202–220 of the method 200 may be repeated to form multiple levels of interconnect(s).

Figure 4:
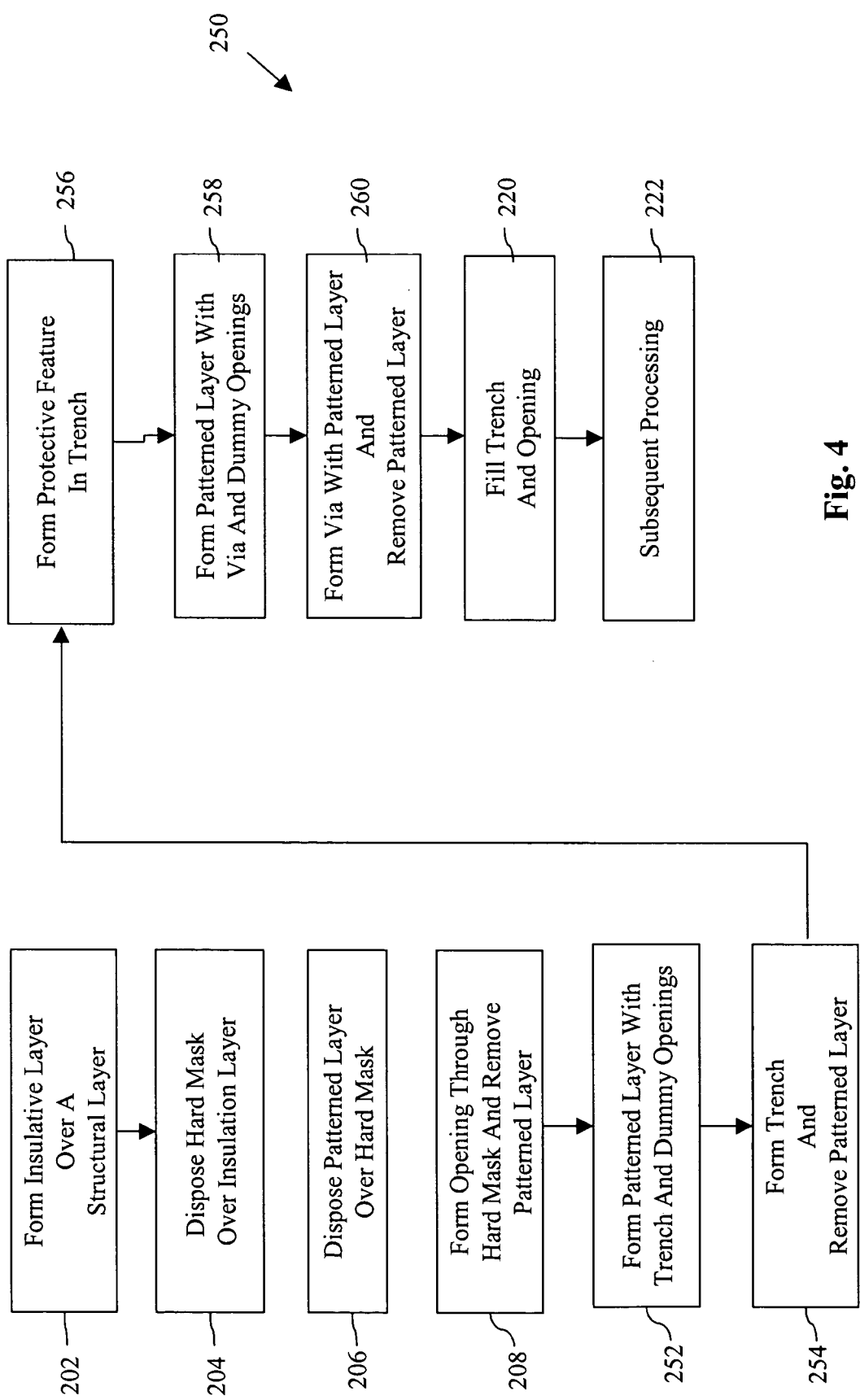

Referring now to FIG. 4, a method 250 can also be used for manufacturing an interconnect on the substrate 102. For the sake of further example, the method 250 will be discussed with reference to FIGS. 1, 3a–3d, and 5a–5d.

Referring specifically to FIGS. 4 and 3a–3d, steps 202–208 are performed in a similar manner as discussed above with reference to the method 200 of FIG. 2. As a result, the opening 312 is formed extending through the hard mask layer 306.

Figure 5C:
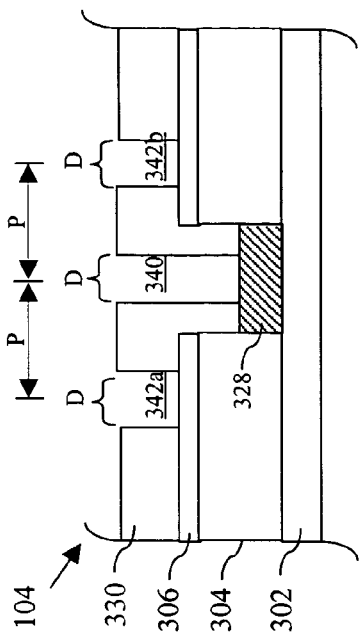
FIGS. 5a–5d are sectional views of at least a portion of another embodiment of an interconnect constructed according to aspects of the present disclosure.
Figure 5D:
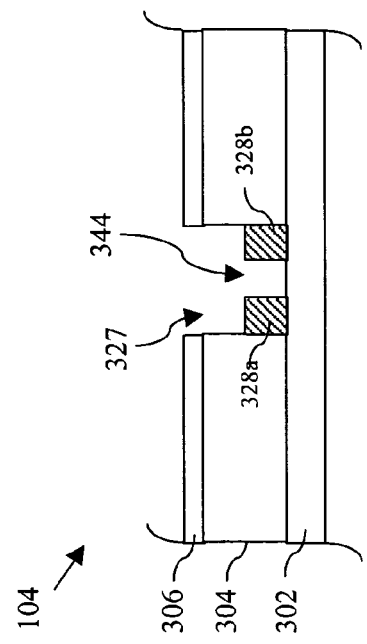
Figure 5A:
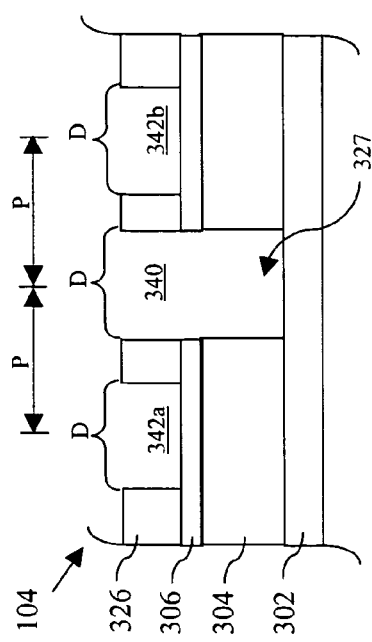

Referring now to FIGS. 4 and 5a, execution of the method 250 proceeds to step 252, where a pattern layer 326 is disposed over the hard mask layer 306. The patterned layer 326 includes the opening 309 and the dummy openings 316a and 316e. The patterned layer 326, in one embodiment, may include one or more layers formed by spin-on coating, and optical lithography in-conjunction with the reticle 102.

In the present embodiment, the openings 309, 316a, and 316e are of a different size than the openings discussed with reference to FIG. 3e. However, the openings 309, 316a, and 316e, as well as additional openings, can be formed using the reticle 102 of FIG. 1 (with the appropriate sized openings).

Referring also to FIG. 5a, at step 254, patterned layer 326 is removed and the opening 327 is formed through the insulative layer 304. The opening 327 may be formed by plasma etching and/or chemical etching. The patterned layer 326 may be removed in an oxygen ($O_2$) plasma environment, and/or in a chemical etch environment.

Figure 5B:
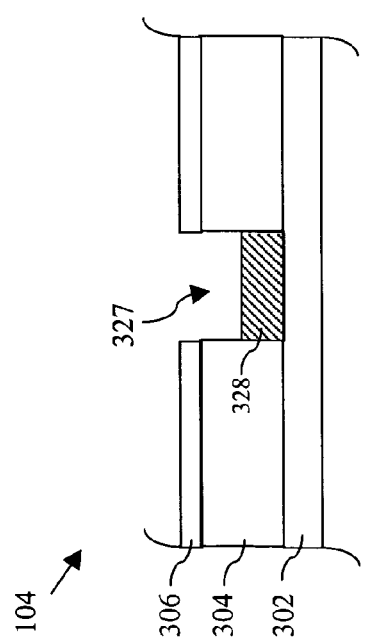

Referring also to FIG. 5b, at step 256, a protective feature 328 is created within a portion of the opening 327. The protective feature 325 may include a plug substantially filling the opening 327. Alternatively, the protective feature 328 may include a liner located substantially over the bottom and sidewalls of the opening 327. In one embodiment, the protective feature 328 may be substantially similar in composition to the insulative layer 304. The protective feature 328 may include one or more layers which may be formed by selective and/or blanket CVD, ALD, electrophoresis, and/or other processing techniques. In the present embodiment, the protective feature 328 includes a low-k dielectric. In other embodiments, the protective feature 328 may include FSG, $SiO_2$, and/or other materials.

Referring also to FIG. 5c, at step 258, a patterned layer 330 is formed over the hard mask layer 306 and over a portion of the insulative layer 304 sidewalls and the protective feature 328. The patterned layer 330, in one embodiment, may include one or more layers formed by spin-on coating, and optical lithography in-conjunction with the reticle 102. The patterned layer 330 may include openings 314 and the dummy openings 316. The openings 314 may be adapted for forming a via, a contact, and/or other features through the protective feature 328.

Referring also to FIG. 5d, at step 338, opening 318 is formed and the patterned layer 330 is removed. The opening 318 may extend through the protective feature 328. The opening 318 may include a via, a contact, and/or other feature. The opening 318 may be formed by plasma etching, chemical etching, FIB, and/or other processing techniques. The patterned layer 328 may be removed by plasma etching and/or chemical etching.

Figure 6:
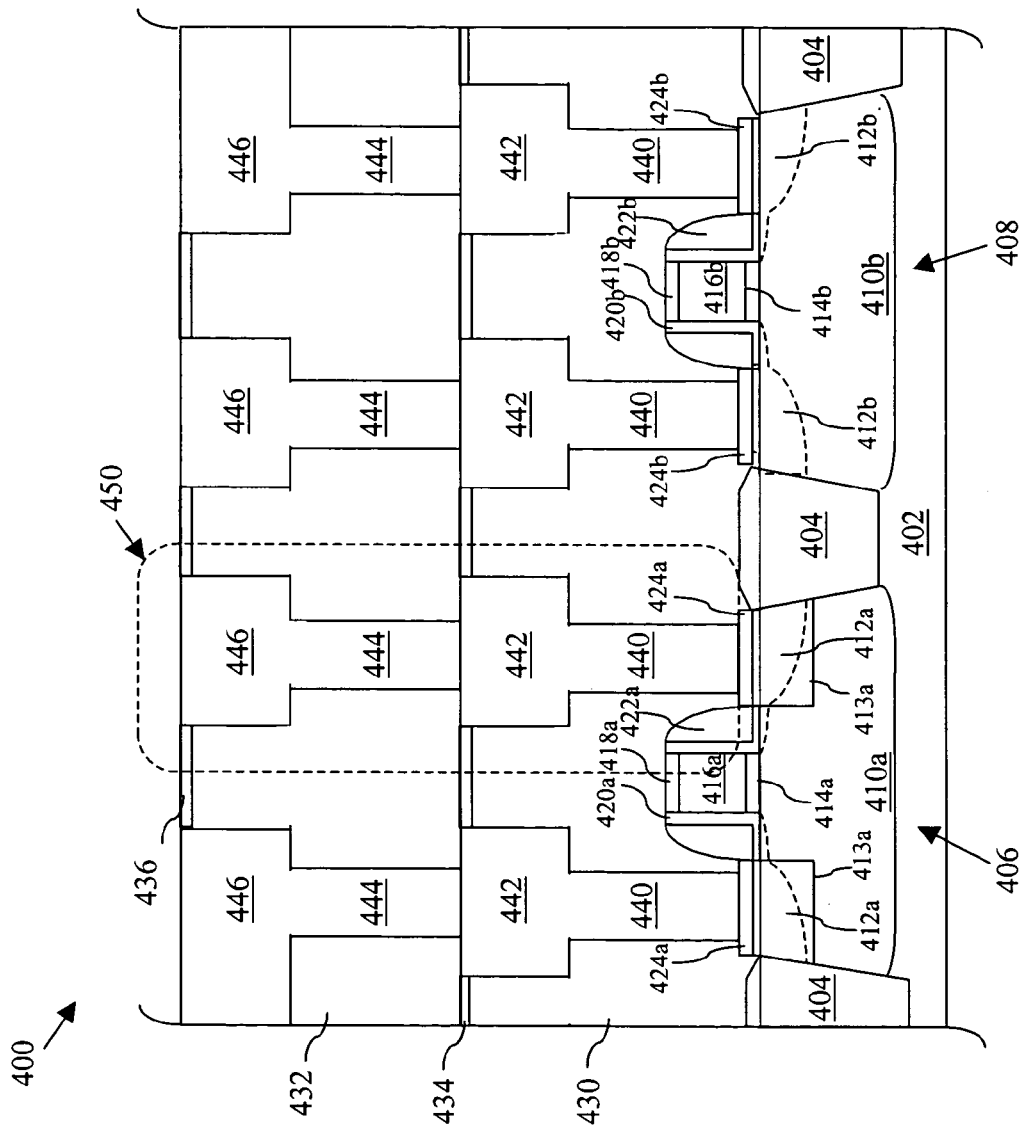
FIG. 6 is a sectional view of at least a portion of one embodiment of an integrated circuit constructed according to aspects of the present disclosure.

Referring to FIG. 6, illustrated is a sectional view of at least a portion of one embodiment of an integrated circuit device 400 constructed according to aspects of the present disclosure. The integrated circuit device 400 is one environment in which embodiments of the lithographic system 100 and interconnect shown in FIGS. 3a–j, and/or 5a–d may be implemented. In one embodiment, the lithographic system 100 and/or the methods 200 and/or 250 may be employed to form the interconnect 450. The interconnect 450 may also be fabricated in conjunction with microelectronic devices 406 and 408, including a one-, two- or three-dimensional array, and may be oriented in one or more rows and/or one or more columns, such as on or over a substrate 402.

The microelectronic devices 406 and 408 include doped wells 410a–b, doped regions 412a–b, gate dielectrics 414a–b, gate electrodes 416a–b, gate contacts 418a–b, sidewall dielect 420a–b, spacers 422a–b, and salicided contacts 424a–b disposed over a substrate 402 each separated by isolation regions 404.

The substrate 402 may be similar in composition to the structural layer 302. In the present embodiment, the substrate 402 may include silicon, silicon-on-insulation (SOI), germanium-on-insulator (GOI), and/or other layers.

The isolation regions 404 may be formed by local oxidation of silicon (LOCOS), shallow trench isolation (STI) and/or other processes. For example, the isolation regions 404 may be formed by etching or otherwise patterning recesses in the substrate 402 and subsequently filling the recesses with silicon dioxide and/or other electrically insulating materials, possibly by CVD.

The doped wells 410a–b may be formed by diffusion, ion implantation and/or other conventional and/or fuiture developed processing techniques. The doped wells 410a–b may include N-type and/or P-type impurities such as phosphorous, arsenic, boron, carbon, germanium, and/or other materials.

The doped regions 412a–b may be positioned over the doped wells 410a–b, and may include heavily doped regions and/or lightly doped regions. The doped regions 412a–b may include N-type and/or P-type impurities such as phosphorous, arsenic, boron, carbon, germanium, and/or other materials. In one embodiment, the microelectronic device 406 includes doped regions 413a having silicon germanium (SiGe), silicon carbide (SiC), and/or other materials formed by selective epitaxial growth (SEG), CVD, PVD, ALD, and/or other processing techniques.

The gate dielectrics 414a–b may include silicon dioxide ($SiO_2$), silicon nitride ($Si_xN_y$), silicon oxy-nitride (SiON), high-k dielectric, and/or other materials. The gate dielectrics 414a–b may be formed by thermal oxidation, rapid thermal oxidation (RPO), CVD, ALD, and/or other processing techniques.

The gate electrodes 416a–b includes polysilicon, high-k dielectric, strained silicon, silicon germanium, silicides, and/or other materials. The gate electrodes 416a–b may be formed by SEG, CVD, PECVD, ALD, and/or other processing techniques.

The sidewall dielectrics 420a–b and spacers 422a–b may be adapted for protecting the gate electrodes 416a–b and the gate dielectrics 414a–b from oxygen and aid in the formation of the doped regions 412a–b. The sidewall dielectrics 420a–b and spacers 422a–b may include silicon dioxide ($SiO_2$), silicon nitride ($Si_xN_y$), silicon oxy-nitride (SiON), and/or other materials. The sidewall dielectrics 420a–b and spacers 422a–b may be formed by thermal oxidation, rapid thermal oxidation (RPO), CVD, PECVD, ALD, and/or other processing techniques.

The gate contacts 418a–b and salicided contacts 424a–b include a metal silicide such as nickel silicide ($NiSi_x$), cobalt silicide ($CoSi_x$), tungsten silicide ($WSi_x$), and/or other materials. The gate contacts 418a–b and salicided contacts 424a–b may be formed by CVD, PECVD, ALD, metal organic chemical vapor deposition (MOCVD), and/or other processing techniques.

The integrated circuit device 400 also includes interconnects 450 having contacts 440, vias 444, trenches 442 and 446 extending along and/or through one or more hard mask layers 434 and 436, and dielectric layers 430 and 432 to ones of the plurality of microelectronic devices 406 and 408. In the present embodiment, the dielectric layers 430 and 432 comprise low-k dielectric. In other embodiments, the dielectric layers 430 and 432 may be similar in composition to the insulative layer 304. The interconnect(s) 450 may be similar in composition to the conductive material 324.

Thus, the present disclosure introduces a method of manufacturing a semiconductor device. The method includes providing an insulative layer above a semiconductor substrate, and providing a hard mask above the insulative layer. The hard mask may include a first portion positioned for preventing trench formation and a second portion adapted for allowing trench formation. The method also includes forming a plurality of openings above the hard mask, at least one of the openings. The openings corresponding to the first portion of the hard mask and at least a second one of the openings corresponding to the second portion of the hard mask. The method further includes forming a trench using the second portion of the hard mask.

Another embodiment of the present disclosure includes a method of manufacturing an interconnect. The method provides for disposing a low-k dielectric layer above a semiconductor substrate. The method also provides for disposing a hard mask layer over the low-k dielectric layer, and forming a patterned layer over the hard mask layer. The patterned layer may include a plurality of dummy openings interposing an opening extending through the patterned layer. The method may provide steps for patterning the hard mask layer through the opening of the patterned layer, and sequentially removing the patterned layer. The method also provides manufacturing steps for forming a protective feature in an opening of the low-k dielectric layer, and forming a trench located over the protective feature and the opening. The method further includes manufacturing steps for removing the protective feature and sequentially filling the opening, and filling the trench and the opening of the low-k dielectric layer with a conductive material.

The present disclosure also introduces a lithographic system adapted for the manufacturing of an integrated circuit. The lithographic system includes a reticle, comprising a substrate having features and a plurality of dummy features interposing the features. The dummy features may be adapted for modifying the optical characteristics of the features. The plurality of dummy features may be positioned at pre-determined positions separated by a pre-determined distance relative to the features. The lithographic system also includes a patterned layer located over a substrate having the plurality of dummy features interposing the features formed by a photochemical reaction induced by light transmitting through the reticle, which may be positioned for modifying the optical characteristics of the features.

The foregoing has outlined features of several embodiments according to aspects of the present disclosure. Vias, contacts, and trenches have been used as examples of equivalent features that can benefit from the present invention, and it is understood that other features will similarly benefit. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for creating a hole in a semiconductor wafer, comprising:
    forming a hard mask over a dielectric layer, the hard mask including a solid portion and a first opening;
    providing a patterning layer over the hard mask, the patterning layer including second and third openings, wherein the second opening of the patterning layer aligns with the first opening of the hard mask and the third opening of the patterning layer aligns in its entirety with the solid portion of the hard mask; and
    creating the hole in the dielectric layer using the second opening of the patterning layer and the first opening of the hard mask.

2. The method of claim 1 wherein the step of creating the hole further comprises:
    creating a first portion of the hole in the dielectric layer using the second opening, and
    creating a second portion of the hole in the dielectric layer using the first opening.

3. The method of claim 1 wherein the step of creating the hole further comprises:
    creating a first portion of the hole completely through the dielectric layer using the second opening, and
    creating a second portion of the hole partially through the dielectric layer using the first opening, wherein the first portion of the hole has a smaller cross-sectional measurement than the second portion.

4. The method of claim 1 wherein the step of creating the hole further comprises:
    creating a first portion of the hole in the dielectric layer using the first opening prior to providing the patterning layer;
    providing a protective feature in the first portion of the hole; and
    creating a second portion of the hole in the dielectric layer and in the protective feature using the second opening, the second portion of the hole having a lateral dimension that is less than a lateral dimension of the first portion of the hole.

5. The method of claim 4 wherein the protective feature includes a plug substantially filling the hole.

6. The method of claim 4 wherein the protective feature is formed of a dielectric material used in the dielectric layer.

7. The method of claim 6 wherein the protective feature is formed of a dielectric material is low-k dielectric.

8. A method of manufacturing an interconnect, comprising:
    providing a low-k dielectric layer above a semiconductor substrate;
    disposing a hard mask layer over the low-k dielectric layer;
    forming a patterned layer over the hard mask layer, the patterned layer having a plurality of dummy openings interposing an opening extending through the patterned layer;
    patterning the hard mask layer through the opening of the patterned layer, and sequentially removing the patterned layer;
    forming a protective feature in an opening of the low-k dielectric layer;
    forming a trench located over the protective feature and the opening;
    removing the protective feature and sequentially filling the opening; and
    filling the trench and the opening of the low-k dielectric layer with a conductive material;
    wherein the opening and the plurality of dummy openings each include a diameter D separated by a pitch P, the pitch P pre-determined according to a mathematical product of the diameter D multiplied by a constant $\kappa$, wherein $\kappa$ ranges between about 1 and about 3.

9. The method, as set forth in claim 8, wherein the substrate includes silicon-on-insulator (SOI).

10. The method, as set forth in claim 8, wherein the substrate includes germanium-on-insulator (GOI).

11. The method, as set forth in claim 8, wherein the hard mask comprises silicon nitride (SixNy).

12. The method, as set forth in claim 8, wherein the hard mask comprises silicon oxy-nitride (SiON).

13. The method, as set forth in claim 8, wherein the conductive material further comprises a barrier layer and a bulk layer.

14. The method, as set forth in claim 8, wherein the pattern layer comprises photoresist.

15. The method, as set forth in claim 8, wherein the protective feature comprises photoresist.

16. The method, as set forth in claim 8, wherein the pitch P may range between about 10 Angstroms and about 4600 Angstroms.

17. A reticle for use in a lithographic system for the manufacturing of an integrated circuit device, comprising:
    a substrate comprising a plurality of device features for the integrated circuit device,
    a plurality of dummy features interposing the device features adapted for modifying the optical characteristics of the device features, wherein the plurality of dummy features are positioned at pre-determined locations separated by a pre-determined distance relative to the device features, and wherein the device features and the plurality of dummy features each include a diameter D separated by a minimum pitch P, the pitch P being determined according to a mathematical product of the diameter D multiplied by a constant $\kappa$, wherein $\kappa$ ranges between about 1 and about 3.

18. The reticle of claim 17 wherein the device features are dual-damascene vias.

19. The reticle of claim 17 wherein the plurality of dummy features are positioned in the reticle to modify the depth of focus (DOF) of the device features.

20. The reticle of claim 17 wherein the pitch P is between about 10 Angstroms and about 4600 Angstroms.

* * * * *